(12) United States Patent
Shirahata et al.

(10) Patent No.: US 11,075,318 B2
(45) Date of Patent: Jul. 27, 2021

(54) BUFFER LAYER FILM-FORMING METHOD AND BUFFER LAYER

(71) Applicant: TOSHIBA MITSUBISHI-ELECTRIC INDUSTRIAL SYSTEMS CORPORATION, Chuo-ku (JP)

(72) Inventors: Takahiro Shirahata, Tokyo (JP); Hiroyuki Orita, Tokyo (JP); Takahiro Hiramatsu, Tokyo (JP); Hiroshi Kobayashi, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 411 days.

(21) Appl. No.: 15/305,397

(22) PCT Filed: May 22, 2014

(86) PCT No.: PCT/JP2014/063544
§ 371 (c)(1),
(2) Date: Oct. 20, 2016

(87) PCT Pub. No.: WO2015/177899
PCT Pub. Date: Nov. 26, 2015

(65) Prior Publication Data
US 2017/0047472 A1 Feb. 16, 2017

(51) Int. Cl.
*H01L 31/18* (2006.01)
*H01L 31/0224* (2006.01)

(52) U.S. Cl.
CPC .. *H01L 31/1884* (2013.01); *H01L 31/022483* (2013.01); *Y02E 10/50* (2013.01)

(58) Field of Classification Search
CPC .................................................. C23C 16/4486
See application file for complete search history.

(56) References Cited

U.S. PATENT DOCUMENTS

| | | | |
|---|---|---|---|
| 5,889,295 A | 3/1999 | Rennie et al. | |
| 2001/0003139 A1* | 6/2001 | Barnhart | C07C 37/58 568/802 |
| 2003/0094600 A1* | 5/2003 | Dobler | B82Y 30/00 252/500 |

(Continued)

FOREIGN PATENT DOCUMENTS

| | | |
|---|---|---|
| CN | 101790795 A | 7/2010 |
| CN | 101980366 A | 2/2011 |

(Continued)

OTHER PUBLICATIONS

JP2014-063873, machine translation, 2014 (Year: 2014).*

(Continued)

*Primary Examiner* — Robert A Vetere
(74) *Attorney, Agent, or Firm* — Xsensus LLP (57) ABSTRACT

A method for film-forming a buffer layer to be used for a solar cell, the buffer layer being disposed between a light absorbing layer and a transparent conductive film. Specifically, in this buffer layer film-forming method, a solution is formed into a mist, the solution containing zinc and alumuminum as metal raw materials of the buffer layer. Then, a substrate disposed in the atmosphere is heated. Then, the mist of the solution is sprayed to the substrate being heated.

6 Claims, 5 Drawing Sheets

| FILM-FORMING TEMPERATURE | 120°C | | | |
|---|---|---|---|---|
| Al/(Al+Zn) RAW MATERIAL SOLUTION | 0.1 | 0.2 | 0.35 | 0.5 |
| Al/(Al+Zn) EDX | 0.07 | 0.16 | 0.21 | 0.24 |

| FILM-FORMING TEMPERATURE | 150°C | | | |
|---|---|---|---|---|
| Al/(Al+Zn) RAW MATERIAL SOLUTION | 0.1 | 0.2 | 0.5 | 0.75 |
| Al/(Al+Zn) EDX | 0.06 | 0.10 | 0.17 | 0.31 |

| FILM-FORMING TEMPERATURE | 200°C | | | |
|---|---|---|---|---|
| Al/(Al+Zn) RAW MATERIAL SOLUTION | 0.1 | 0.2 | 0.5 | 0.75 |
| Al/(Al+Zn) EDX | 0.01 | 0.05 | 0.20 | 0.33 |

| FILM-FORMING TEMPERATURE | 250°C | | | |
|---|---|---|---|---|
| Al/(Al+Zn) RAW MATERIAL SOLUTION | 0.1 | 0.2 | 0.5 | 0.75 |
| Al/(Al+Zn) EDX | 0.09 | 0.11 | 0.38 | 0.39 |

| FILM-FORMING TEMPERATURE | 300°C | | | |
|---|---|---|---|---|
| Al/(Al+Zn) RAW MATERIAL SOLUTION | 0.1 | 0.2 | 0.5 | 0.75 |
| Al/(Al+Zn) EDX | 0.10 | 0.17 | 0.44 | 0.56 |

(56) References Cited

U.S. PATENT DOCUMENTS

| | | | | |
|---|---|---|---|---|
| 2004/0230271 | A1* | 11/2004 | Wang | A61M 25/0045 607/116 |
| 2010/0206719 | A1* | 8/2010 | Takahashi | C23C 14/08 204/192.25 |
| 2012/0247553 | A1 | 10/2012 | Burrows et al. | |
| 2013/0309613 | A1* | 11/2013 | O'Malley | H01L 31/1884 430/319 |

FOREIGN PATENT DOCUMENTS

| | | | |
|---|---|---|---|
| CN | 102237451 A | 11/2011 | |
| CN | 102544237 A | 7/2012 | |
| CN | 102770969 A | 11/2012 | |
| DE | 100 10 177 A1 | 9/2000 | |
| JP | 8-330614 A | 12/1996 | |
| JP | 9-293936 A | 11/1997 | |
| JP | 2000-044238 A | 2/2000 | |
| JP | 2003-197935 | 7/2003 | |
| JP | 2003-229281 A | 8/2003 | |
| JP | 2006-332440 A | 12/2006 | |
| JP | 3966732 B2 | 8/2007 | |
| JP | 2013-026415 A | 2/2013 | |
| JP | 2013-149697 | 8/2013 | |
| JP | 2014-063873 A | 4/2014 | |
| JP | 2014063879 A | * 4/2014 | |
| KR | 10-2010-0036382 | 4/2010 | |
| TW | 201027779 A1 | 7/2010 | |
| WO | 2009/038094 A1 | 3/2009 | |

OTHER PUBLICATIONS

Kawaharamura et al., "Effect of O3 and Aqueous Ammonia on Crystallization of MgO Thin Film Grown by Mist Chemical Vapor Deposition," 2013, Jap. J. Appl. Phys., 52, p. 035501. (Year: 2013).*

Kim et al., "Effect of aluminum doping on zinc oxide thin films grown by pulsed laser deposition for organic light-emitting devices", 2000, Thin Solid Films 377-378, pp. 798-802. (Year: 2000).*

Office Action dated Jul. 12, 2017 in Korean Patent Application No. 10-2016-7021837 (with English translation).

Office Action dated Mar. 21, 2017 in Japanese Patent Application No. 2016-520871 (with Partial English translation).

International Preliminary Report on Patentability and Written Opinion dated Dec. 1, 2016 in PCT/JP2014/063544 (English translation only).

International Search Report dated Jul. 8, 2014, in PCT/JP2014/063544, filed May 22, 2014.

Office Action dated Jan. 11, 2016 in Taiwan Patent Application No. 104100691 (With partial English translation).

Takayuki Uchida et al., "The Effect of $O_3$ Support for Fabrication of $AlO_x$ Thin Film by Mist CVD Technique", Journal of the Society of Materials Science, Japan, vol. 62, No. 11, Nov. 2013, pp. 663-667 (with English Abstract).

Toshiyuki Kawaharamura et al., "Effect of $O_3$ and Aqueous Ammonia on Crystallization of MgO Thin Film Grown by Mist Chemical Vapor Deposition", Japanese Journal of Applied Physics, vol. 52, Feb. 14, 2013, pp. 035501-1 to 035501-5.

Combined Chinese Office Action and Search Report dated Mar. 20, 2017, in Patent Application No. 201480076630.5 (with English translation).

Office Action dated Dec. 14, 2018 in German Patent Application No. 11 2014 006 695.8 (with English translation).

Office Action dated Dec. 18, 2018 in German Patent Application No. 11 2014 006 695.8 (with English translation).

Office Action dated May 8, 2019, in German Patent Application No. 11 2014 006 695.8 (w/English-language translation); 13 pgs.

J.G. Lu, et al.; "Structural, optical, and electrical properties of (Zn,Al)O films over a wide range of compositions"; Journal of Applied Physics, 2006, H. 100, S. 073714 1-10; 12 pgs.

* cited by examiner

| Al/(Al+Zn) RAW MATERIAL SOLUTION | 120°C | 150°C | 200°C | 250°C | 300°C |
|---|---|---|---|---|---|
| 0 | 3.57eV | 3.52eV | 3.38eV | 3.32eV | 3.30eV |
| 0.1 | 3.65eV | 3.58eV | 3.45eV | 3.46eV | 3.52eV |
| 0.2 | 3.75eV | 3.68eV | 3.55eV | 3.60eV | 3.64eV |
| 0.35 | 4.04eV | WITHOUT DATA | | | |
| 0.5 | >5eV | 3.96eV | 3.96eV | 4.25eV | 4.25eV |

F I G. 4

| Al/(Al+Zn) RAW MATERIAL SOLUTION | 120°C | 150°C | 200°C | 250°C | 300°C |
|---|---|---|---|---|---|
| 0 | 1.1E+03 Ω·cm | 1.0E+02 Ω·cm | 1.7E+01 Ω·cm | 7.3E-01 Ω·cm | 7.3E-02 Ω·cm |
| 0.1 | 3.1E+04 Ω·cm | 1.8E+02 Ω·cm | 1.9E+01 Ω·cm | 2.6E+00 Ω·cm | 8.0E-01 Ω·cm |
| 0.2 | 2.2E+07 Ω·cm | 1.9E+03 Ω·cm | 1.3E+02 Ω·cm | 3.0E+02 Ω·cm | 2.0E+01 Ω·cm |
| 0.35 | >1E+8 Ω·cm | | | WITHOUT DATA | |
| 0.5 | >1E+8 Ω·cm | 2.3E+06 Ω·cm | 5.3E+04 Ω·cm | 3.9E+05 Ω·cm | 4.3E+04 Ω·cm |
| 0.75 | WITHOUT DATA | >1E+8 Ω·cm | >1+E8 Ω·cm | >1E+8 Ω·cm | >1E+8 Ω·cm |

F I G. 5

| FILM-FORMING TEMPERATURE | 120°C | | | |
|---|---|---|---|---|
| Al/(Al+Zn) RAW MATERIAL SOLUTION | 0.1 | 0.2 | 0.35 | 0.5 |
| Al/(Al+Zn) EDX | 0.07 | 0.16 | 0.21 | 0.24 |

| FILM-FORMING TEMPERATURE | 150°C | | | |
|---|---|---|---|---|
| Al/(Al+Zn) RAW MATERIAL SOLUTION | 0.1 | 0.2 | 0.5 | 0.75 |
| Al/(Al+Zn) EDX | 0.06 | 0.10 | 0.17 | 0.31 |

| FILM-FORMING TEMPERATURE | 200°C | | | |
|---|---|---|---|---|
| Al/(Al+Zn) RAW MATERIAL SOLUTION | 0.1 | 0.2 | 0.5 | 0.75 |
| Al/(Al+Zn) EDX | 0.01 | 0.05 | 0.20 | 0.33 |

| FILM-FORMING TEMPERATURE | 250°C | | | |
|---|---|---|---|---|
| Al/(Al+Zn) RAW MATERIAL SOLUTION | 0.1 | 0.2 | 0.5 | 0.75 |
| Al/(Al+Zn) EDX | 0.09 | 0.11 | 0.38 | 0.39 |

| FILM-FORMING TEMPERATURE | 300°C | | | |
|---|---|---|---|---|
| Al/(Al+Zn) RAW MATERIAL SOLUTION | 0.1 | 0.2 | 0.5 | 0.75 |
| Al/(Al+Zn) EDX | 0.10 | 0.17 | 0.44 | 0.56 |

FIG. 6

| Mg/(Mg+Zn) RAW MATERIAL SOLUTION | 0 | 0.17 | 0.29 | 0.375 | 0.44 | 0.5 |
|---|---|---|---|---|---|---|
| BAND GAP[eV] | 3.53 | 3.57 | 3.61 | 3.63 | 3.65 | 3.67 |
| RESISTIVITY[$\Omega \cdot cm$] | 1.7E+01 | 1.3E+01 | 2.0E+01 | 4.4E+01 | 7.0E+01 | 1.7E+02 |

FIG. 7

| Al/(Al+Zn) RAW MATERIAL SOLUTION | 120°C | 150°C | 200°C | 250°C | 300°C |
|---|---|---|---|---|---|
| 0 | 96.0 | 94.2 | 94.5 | 92.9 | 88.9 |
| 0.1 | 96.1 | 94.1 | 94.2 | 91.9 | 90.3 |
| 0.2 | 97.5 | 94.5 | 93.1 | 92.9 | 91.8 |
| 0.35 | 97.1 | WITHOUT DATA | | | |
| 0.5 | 97.5 | 97.0 | 95.6 | 96.0 | 95.2 |
| 0.75 | WITHOUT DATA | 96.8 | 97.2 | 96.7 | 97.8 |

BUFFER LAYER FILM-FORMING METHOD AND BUFFER LAYER

TECHNICAL FIELD

The present invention relates to a buffer layer to be used for a solar cell, and a method for film-forming the buffer layer.

BACKGROUND ART

In a CIS-based solar cell, in order to improve conversion efficiency, a buffer layer is disposed between a light absorbing layer and a transparent conductive film, and a conduction band offset (band offset) is formed between the light absorbing layer and a buffer layer. The band offset is defined as a difference in energy at a lower end of a conduction band between the buffer layer and the light absorbing layer. When the energy at a lower end of the conduction band of the buffer layer is higher than the energy at a lower end of the conduction band of the light absorbing layer, the band offset is denoted by "+". On the other hand, when the energy at a lower end of the conduction band of the buffer layer is lower than the energy at a lower end of the conduction band of the light absorbing layer, the band offset is denoted by "−". An optimum band offset is said to be 0 to +0.4 eV. In the future, it becomes important to control the band gap of the buffer layer when a wide band gap of the light absorbing layer is advanced in order to further improve conversion efficiency.

The buffer layer is a layer of a thin film, and has a large effect on the performance of a solar cell resulting from formation of the above-mentioned conduction band band offset. As the buffer layer, a metal compound containing cadmium or indium is predominantly used. Further, conventionally, a solution growth method has been employed as a method for film-forming a buffer layer.

In addition, as a conventional technology concerning production of a solar cell including the buffer layer, for example, Patent Document 1 and Patent Document 2 are present.

PRIOR ART DOCUMENTS

Patent Document

Patent Document: Japanese Patent Application Laid-Open. No. 08-330614 (1996)
Patent Document 2: Japanese Patent Application Laid-Open. No. 2006-332440

SUMMARY OF INVENTION

Problems to be Solved by the Invention

Conventionally, as a buffer layer, a raw material which is hard to handle (waste disposal, etc.), such as cadmium and sulfur, and an expensive raw material such as indium are used. Accordingly, it is desired to develop a novel buffer layer whose production is easy and production cost can be reduced.

Further, a buffer layer whose band gap can be controlled over a wide range is also desired. In the buffer layer, there exists a proportional relation between the magnitude of the band gap and the magnitude of the conduction band band offset. Accordingly, use of the buffer layer whose band gap can be controlled over a wide range allows production of conduction band band offsets having various magnitude, and it is useful from the viewpoint of expansion of use.

Further, when the buffer layer is film-formed by the solution growth method, a large amount of liquid waste disposal is required and production cost is increased. Further, it is extremely important to produce a buffer layer having a desired band gap with high accuracy (referred to as controllability of a band gap). However, in the solution growth method, there has been a problem that the buffer layer is low in the controllability of a band gap. That is, in the solution growth method, it has been difficult to prepare accurately a buffer layer having a desired band gap (variations in band gap results between the buffer layers produced).

Thus, it is an object of the present invention to provide a method for film-forming a buffer layer which is simple in a process, low in cost, and excellent in the controllability of the band gap. It is another object of the present invention to provide a novel buffer layer which can be easily produced, is capable of reducing its production cost and controlling a band gap over a wide range.

Means for Solving the Problems

In order to achieve the above-mentioned object, a method for film-forming a buffer layer according to the present invention is a method for film-forming a buffer layer to be used for a solar cell, the buffer layer being disposed between a light absorbing layer and a transparent conductive film, which includes the steps of (A) forming a solution containing zinc and aluminum as metal raw materials of the buffer layer into a mist, (B) heating a substrate disposed in the atmosphere, and (C) spraying a mist of the solution atomized in the step (A) to the substrate in the step (B).

Further, in order to achieve the above-mentioned object, a buffer layer according to the present invention is a buffer layer to be used for a solar cell, the buffer layer being disposed between a light absorbing layer and a transparent conductive film, wherein the buffer layer is a $Zn_{1-x}Al_xO$ film containing zinc and aluminum. In the above formula, x satisfies a relationship of $0<x<1$.

Effects of the Invention

A method for film-forming a buffer layer according to the present invention is a method for film-forming a buffer layer to be used for a solar cell, the buffer layer being disposed between a light absorbing layer and a transparent conductive film, which comprises the steps of (A) forming a solution containing zinc and aluminum as metal raw materials of the buffer layer into a mist, (B) heating a substrate disposed in the atmosphere, and (C) spraying a mist of the solution atomized in the step (A) to the substrate in the step (B).

In the method for film-forming a buffer layer, since a pressure in the reaction container does not need to be reduced and a mist of the solution which is liquid is used for film-forming instead of gas, the buffer layer can be film-formed by a process step which is simple and low in cost.

Further, in the method for film-forming a buffer layer, a mist method is employed. Accordingly, the film-forming is hardly vulnerable to interference (external disturbance). Therefore, it is possible to film-form a buffer layer having a band gap of an aimed value on a substrate by only adjusting the content ratio of (Al/Zn) in the solution (that is, the method is excellent in controllability of a band gap and controllability of resistivity).

Further, a buffer layer according to the present invention is a buffer layer to be used for a solar cell, the buffer layer being disposed between a light absorbing layer and a transparent conductive film, wherein the buffer layer is a $Zn_{1-x}Al_xO$ film containing zinc and aluminum. In the above formula, x satisfies a relationship of $0<x<1$.

The buffer layer according to the present invention is produced by using zinc and aluminum which are easily handled and disposed of and is inexpensive. Therefore, production of the buffer layer becomes easy and production cost can be reduced. Further, in the buffer layer, the band gap and the resistivity of the buffer layer can be controlled (adjusted) over a wide range by varying an amount of aluminum relative to an amount of zinc.

The object, features, aspects and advantages of the present invention will become more apparent from the following detailed description and accompanying drawings.

DESCRIPTION OF EMBODIMENTS

The present invention relates to a buffer layer to be used for a solar cell, the buffer layer being disposed between a light absorbing layer and a transparent conductive film, and a method for film-forming the buffer layer. The present inventors found through a great deal of research and development that a $Zn_{1-x}Al_xO$ film containing zinc and aluminum is useful as a novel buffer layer. Here, x satisfies a relationship of $0<x<1$. Further, the present inventors also found that as the method for film-forming a buffer layer, a mist method implemented in the atmosphere, described later, is useful.

In addition, as described above, an object of the present invention is a "buffer layer", and is not a "conductive film" which is low in resistance. Here, a trace of aluminum is sometimes introduced into a zinc oxide film as a dopant. This film (Al-doped ZnO) is a conductive body (resistivity is about $10^{-3}$ $\Omega \cdot cm$ or less), and the amount of aluminum introduced thereinto is at most about 1% with respect to the amount of zinc. Further, when aluminum is introduced into the zinc oxide film as a dopant, transmittance tends to be reduced in the film to be film-formed (particularly, the transmittance of light of a wavelength of 1500 nm or longer tends to be significantly reduced).

In contrast with this, the buffer layer of the object of the present invention is a $Zn_{1-x}Al_xO$ film ($0<x<1$), and even when the amount of aluminum to be mixed is changed, high transparency is maintained (for example, a high value is maintained even in the transmittance of light of a wavelength of 1500 nm or longer in the $Zn_{1-x}Al_xO$ film according to the present invention).

Further, in the present invention, aluminum to be mixed is employed as metal raw materials of the buffer layer to be produced (that is, aluminum is contained as a mixed crystal in the film film-formed). Accordingly, the $Zn_{1-x}Al_xO$ film according to the present invention includes aluminum in an amount larger than the amount in the case where aluminum is introduced as a dopant. In the present invention, an amount of aluminum relative to an amount of zinc in a raw material solution is, for example, 10% or more. Further, the resistivity of the $Zn_{1-x}Al_xO$ film is 10 $\Omega \cdot cm$ or more, and the film is not said to be a conductor.

A $Zn_{1-x}Al_xO$ film serving as the buffer layer is produced by using zinc and aluminum which are easily handled and disposed of and is inexpensive. Therefore, production of the buffer layer becomes easy and production cost can be reduced. Further, the present inventors found that in the buffer layer, the band gap and the resistivity of the buffer layer can be controlled (adjusted) over a wide range by varying an amount of aluminum relative to an amount of zinc.

Hereinafter, in embodiments, the method for film-forming a buffer layer will be specifically described based on drawings.

Embodiments

Figure 1:
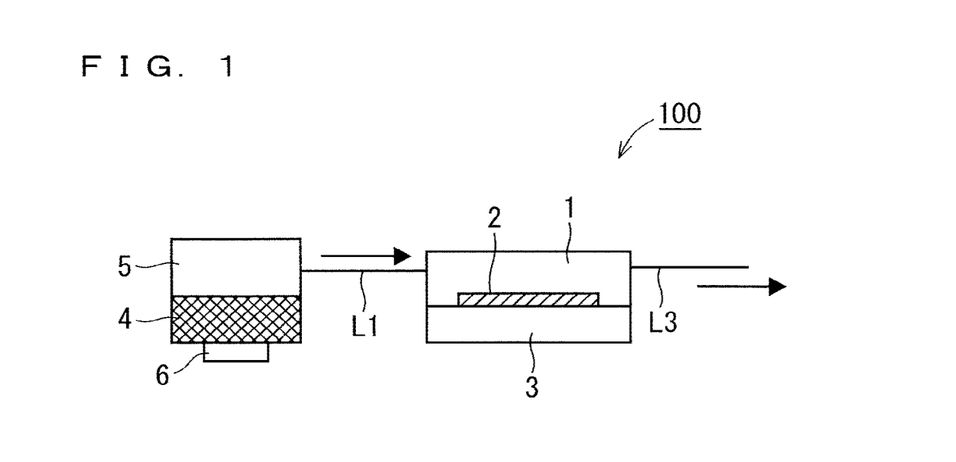
FIG. 1 is a view showing a configuration of a film forming apparatus in which a method for film-forming a buffer layer according to the present invention is implemented.

FIG. 1 is a view showing a schematic configuration of an apparatus for film-forming a buffer layer of the present embodiment.

As shown in FIG. 1, the apparatus for film-forming a buffer layer 100 of Embodiment 1 is configured of a reaction container 1, a heater 3, a solution container 5 and a mist generator 6 (atomizer).

In the film forming apparatus 100, the mist method is implemented. That is, by spraying a mist of raw material solution 4 to the substrate 2 disposed in the atmosphere, a buffer layer is film-formed on the substrate 2.

Here, the heater 3 is disposed in the reaction container 1. Then, the substrate 2 is heated by the heater 3 during film-forming. Further, a light absorbing layer is film-formed on the surface of the substrate 2.

The heater 3 is, for example, a heating apparatus, and a heating temperature of the heater 3 is adjusted by an external control part during film-forming, and the substrate 2 is heated to a desired temperature. In the present invention, it is an object to lower a temperature, and for example, the substrate 2 is heated at a temperature between 120° C. and 300° C. by the heater 3.

A raw material solution (hereinafter, referred to as a solution) 4 for film-forming a $Zn_{1-x}Al_xO$ film serving as a buffer layer is filled into the solution container 5. The solution 4 contains zinc (Zn) and aluminum (Al) as a metal source (mixed crystal in the film to be film-formed). More specifically, the solution 4 contains a metal compound having zinc and aluminum. Herein, the metal compound is, for example, a β-diketone compound (acetylacetonato).

As a solvent of the solution 4, water, alcohols such as methanol or other organic solvent, or mixed solution of these liquids can be employed.

For example, an ultrasonic atomizer can be employed as the mist generator 6. The mist generator 6 which is the ultrasonic atomizer forms the solution 4 in the solution container 5 into a mist by applying an ultrasonic wave to the solution 4 in the solution container 5. The mist of the solution 4 is supplied to the reaction container 1 through a path L1.

Then, the solution 4 atomized in the reaction container 1 is sprayed to the substrate 2 being heated to film-form a $Zn_{1-x}Al_xO$ film serving as a buffer layer on the substrate 2. Here, the solution 4 which is left unreacted in the reaction container 1 is discharged out of the reaction container 1 all the time (in a continuous manner) through the path L3.

Next, a method for film-forming a buffer layer of the present embodiment will be described At first, a solution 4 including zinc and aluminum is prepared. Here, when the amount of aluminum in the solution 4 relative to the amount of zinc in the solution 4 is varied, the resistivity and the band gap of a buffer layer to be film-formed vary.

Specifically, when in the solution 4, the amount of aluminum relative to the amount of zinc is increased, the resistivity of a buffer layer to be film-formed is increased and the band gap of the buffer layer to be produced is increased.

Accordingly, the content of aluminum relative to the content of zinc is adjusted in the solution 4 so that a buffer layer having a desired resistance value and a desired band gap is film-formed.

The prepared solution 4 is formed into a mist by the mist generator 6 in the solution container 5. The mist of the solution 4 is supplied to the reaction container 1 through a path L1.

On the other hand, the substrate 2 is heated to a predetermined temperature by the heater 3, and a heating temperature of the substrate 2 is maintained at a predetermined temperature. For example, the heating temperature of the substrate 2 is maintained, for example, at any temperature of about 120° C. to 300° C.

The mist of the solution 4 is sprayed to the substrate 2 being heated. Thereby, a $Zn_{1-x}Al_xO$ film serving as a buffer layer is film-formed on the substrate 2 existing in the reaction container 1. Here, a value of x satisfies a relationship of $0<x<1$ and varies according to a content ratio of (Al/Zn) in a solution 4 to be prepared.

Further, as described above, the mist of the solution 4 is sprayed to the substrate 2 disposed in the atmosphere.

As described above, in the method for film-forming a buffer layer of the present embodiment, a mist method in which the solution 4 is sprayed to the substrate 2 disposed in the atmosphere is employed.

Thus, in the film-forming method, since a pressure in the reaction container 1 does not need to be reduced and the mist of the solution 4 which is liquid is used for film-forming instead of gas, the buffer layer can be film-formed by a process step which is simple and low in cost.

Further, when the buffer layer is film-formed by the solution growth method, a large apparatus for immersing a substrate is required in the case of film-forming a large area of a buffer layer, and upsizing of an apparatus has been seen as a problem However, in the film forming apparatus 100, it is possible by the mist method to make an apparatus smaller than the apparatus in which the solution growth method is implemented.

Also, when the buffer layer is film-formed by the solution growth method, film-formation is vulnerable to various interference in a reaction process, and it has been difficult to bring the reaction into equilibrium at one point. Therefore, in the buffer layer prepared by the solution growth method, the controllability of a band gap was deteriorated (that is, the buffer layer having a band gap which is different in its value from a band gap of an aimed value was film-formed).

However, in the method for film-forming a buffer layer of the present embodiment, a mist method is employed. Accordingly, the film-forming is hardly vulnerable to interference. Therefore, it is possible to film-form a buffer layer having a band gap of an aimed value on the substrate 2 by only adjusting the content ratio of (Al/Zn) in the solution 4 (that is, the method is excellent in controllability of a band gap).

Further, for example, when the buffer layer of the present invention is film-formed by a CVD method, it is necessary to vaporize an organic metal solution such as diethyl zinc. This leads to complicated constitution of a production apparatus or an increase in production cost.

In contrast with this, in the present invention, the solution 4 can be prepared by using an inexpensive and stable compound, for example, a β-diketone metal compound, and the solution 4 has only to be formed into a mist. Therefore, the film-forming method according to the present invention can film-form the buffer layer by a process step which is more simple and lower in cost than the film-forming method using the CVD method.

Figure 2:
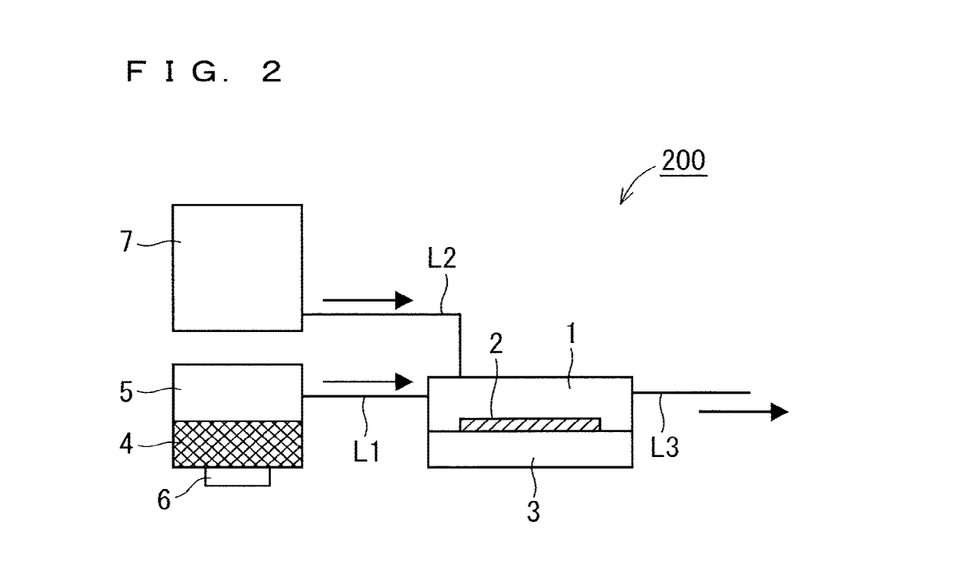
FIG. 2 is a view showing another configuration of a film forming apparatus in which a method for film-forming a buffer layer according to the present invention is implemented.

In addition, ozone may be supplied, in addition to spraying of the mist of the solution 4, to the reaction container 1 in which the substrate 2 being heated is disposed. FIG. 2 is a view showing a schematic configuration of a film forming apparatus for a buffer layer 200 which also supplies ozone.

As is apparent from the comparison between FIG. 1 and FIG. 2, the film forming apparatus 200 has the configuration in which an ozone generator 7 is added to the configuration of the film forming apparatus 100. Further, in the film forming apparatus 200, a path L2 which is a separate path from the path L1 is disposed in order to supply ozone from the ozone generator 7 to a reaction container 1.

The configuration of the film forming apparatus 200 is similar to that of the film forming apparatus 100 except for adding the ozone generator 7 and the path L2.

The ozone generator 7 can generate ozone. Thus, ozone generated by the ozone generator 7 passes through the path L2 different from the path L1 and is supplied into the reaction container 1. In the ozone generator 7, for example, an oxygen molecule is decomposed by applying a high voltage between parallel electrodes disposed in parallel and passing oxygen between the electrodes, and ozone can be generated by coupling the decomposed oxygen with another oxygen molecule.

In the film forming apparatus 200, ozone and the mist of the solution 4 are supplied to the reaction container 1 in which the substrate 2 being heated is disposed. Here, ozone and the solution 4 which are left unreacted in the reaction container 1 are discharged out of the reaction container 1 all the time (in a continuous manner) through the path L3. Further, the substrate 2 is disposed in the atmosphere.

The present inventors found that as described above, when ozone is supplied during film-forming a buffer layer, a desired buffer layer can be film-formed even though the heating temperature of the substrate 2 is lowered (e.g., 120° C. to 200° C.).

Further, in the film forming apparatuses 100 and 200, the solution 4 may contain ammonia. The present inventors found that by allowing the solution 4 to contain ammonia in this way, a desired buffer layer can be film-formed even though the heating temperature of the substrate 2 is lowered (e.g., 120° C. to 200° C.). Herein, the solution 4 may contain ammonia without supplying ozone; however, the solution 4 may contain ammonia and may further be supplied with the ozone.

In addition, the present inventors allows the solution 4 to contain ammonia in a molar ratio $NH_3/Zn$ of about 22.2) and film-forms a buffer layer using a film forming apparatus 200 shown in FIG. 2 (that is, by supplying ozone to a reaction container 1). Further, a film-forming temperature is in a range of 120° C. to 300° C. Here, the buffer layer can be film-formed even at a temperature higher than 300° C.; however, an experiment was omitted from the viewpoint of lowering a temperature. Further, the buffer layer could not be sometimes film-formed at the film-forming temperature less than 120° C.

Figure 3:
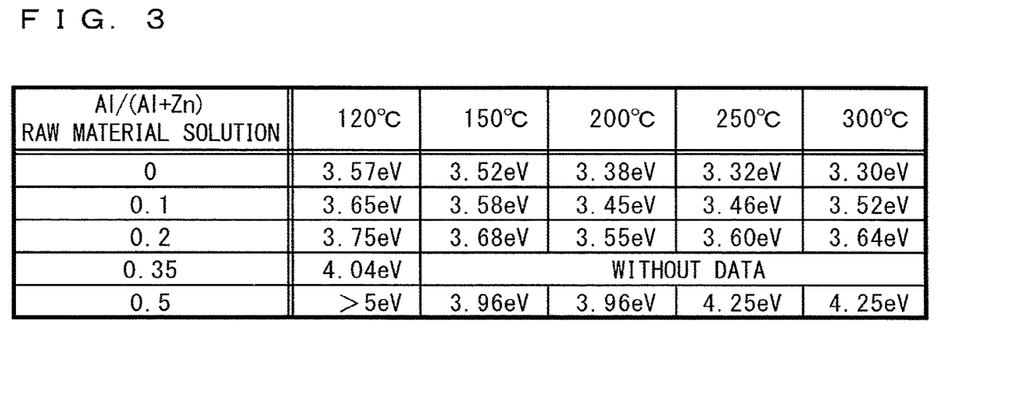
FIG. 3 is a view showing the results of band gap measurement performed on a film-formed buffer layer.

FIG. 3 shows the results at the time when a plurality of buffer layers were prepared varying the content of Al relative to the content of Zn and varying the film-forming temperature, and band gap values (eV) of the buffer layers were measured.

As shown in FIG. 3, Al/(Al+Zn) in the solution 4 is varied to 0, 0.1, 0.2, 0.35, and 0.5 by varying the amount of Al.

Here, the film-formation of the buffer layer was performed varying the film-forming temperature in the condition of Al/(Al+Zn)=0.75. The buffer layer was film-formed at each film-forming temperature; however, a value of a band gap of each buffer layer is over an upper limit of a measuring instrument. Accordingly, in FIG. 3, a band gap value of the buffer layer which was film-formed in the condition of Al/(Al+Zn)=0.75, is not shown.

Further, as shown in FIG. 3, film-formation of the buffer layers was performed varying the film-forming temperature to 120° C., 150° C., 200° C., 250° C., and 300° C. In addition, the film-formation of the buffer layer was not performed at the film-forming temperatures of 150° C., 200° C., 250° C., or 300° C. in the condition of Al/(Al+Zn)=0.35.

As is apparent from FIG. 3, the value of a band gap of the buffer layer film-formed is increased by increasing the additive amount of aluminum. In the range of the results of FIG. 3, the band gap value of the buffer layer ($Zn_{1-x}Al_xO$ film) can be varied at least in the range of 3.52 eV to 4.25 eV by varying the additive amount of aluminum and the film-forming temperature. That is, in the buffer layer according to the present invention, the band gap can be controlled over a wide range.

Figure 4:
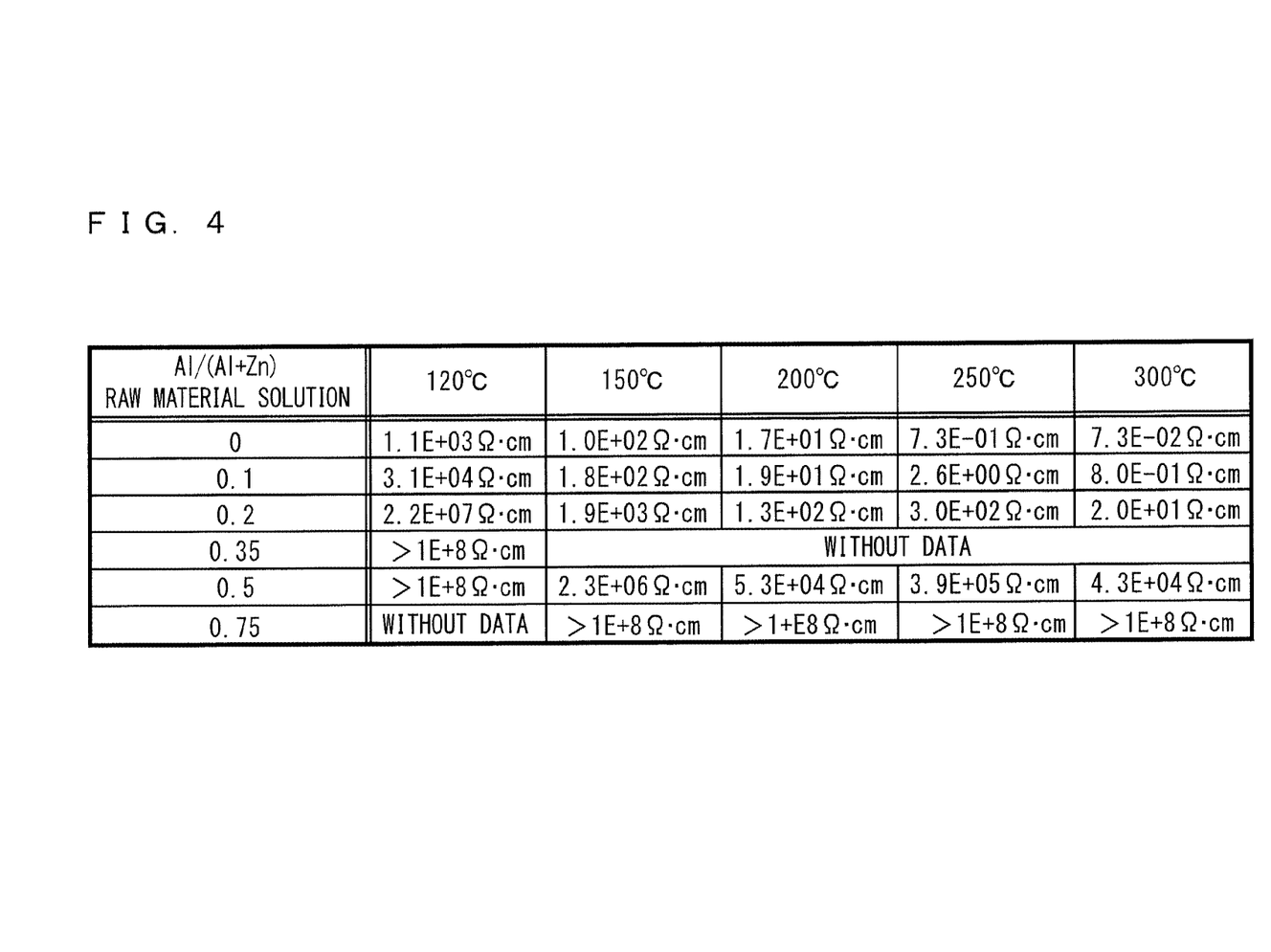
FIG. 4 is a view showing the results of resistivity measurement performed on a film-formed buffer layer.

FIG. 4 shows the results at the time when a plurality of buffer layers were prepared varying the content of Al relative to the content of Zn and varying the film-forming temperature, and resistivity (Ω·cm) of the buffer layers were measured.

As shown in FIG. 4, Al/(Al+Zn) in the solution 4 is varied to 0, 0.1, 0.2, 0.35, 0.5, and 0.75 by varying the amount of Al.

Further, as shown in FIG. 4, film-formation of the buffer layers was performed varying the film-forming temperature to 120° C., 150° C., 200° C., 250° C., and 300° C. In addition, the film-formation of the buffer layer was not performed at the film-forming temperatures of 150° C., 200° C., 250° C., or 300° C. in the condition of Al/(Al +Zn)=0.35. Similarly, the film-formation of the buffer layer was not performed at the film-forming temperature of 120° C. in the condition of Al/(Al+Zn)=0.75.

As is apparent from FIG. 4, the resistivity of the buffer layer film-formed is increased by increasing the additive amount of aluminum. In the range of the results of FIG. 4, the resistivity of the buffer layer ($Zn_{1-x}Al_xO$ film) can be varied at least in the range of $8.0\times10^{-1}$ Ω·cm to $2.2\times10^7$ Ω·cm by varying the additive amount of aluminum and the film-forming temperature. That is, in the buffer layer according to the present invention, the resistivity can be controlled over a wide range.

In addition, from values of the resistivity shown in FIG. 4, it is found that the buffer layer according to the present invention is neither a conductive body nor an insulating body, and is a substance having an electric conductivity intermediate between the conductive body and the insulating body.

Figure 5:
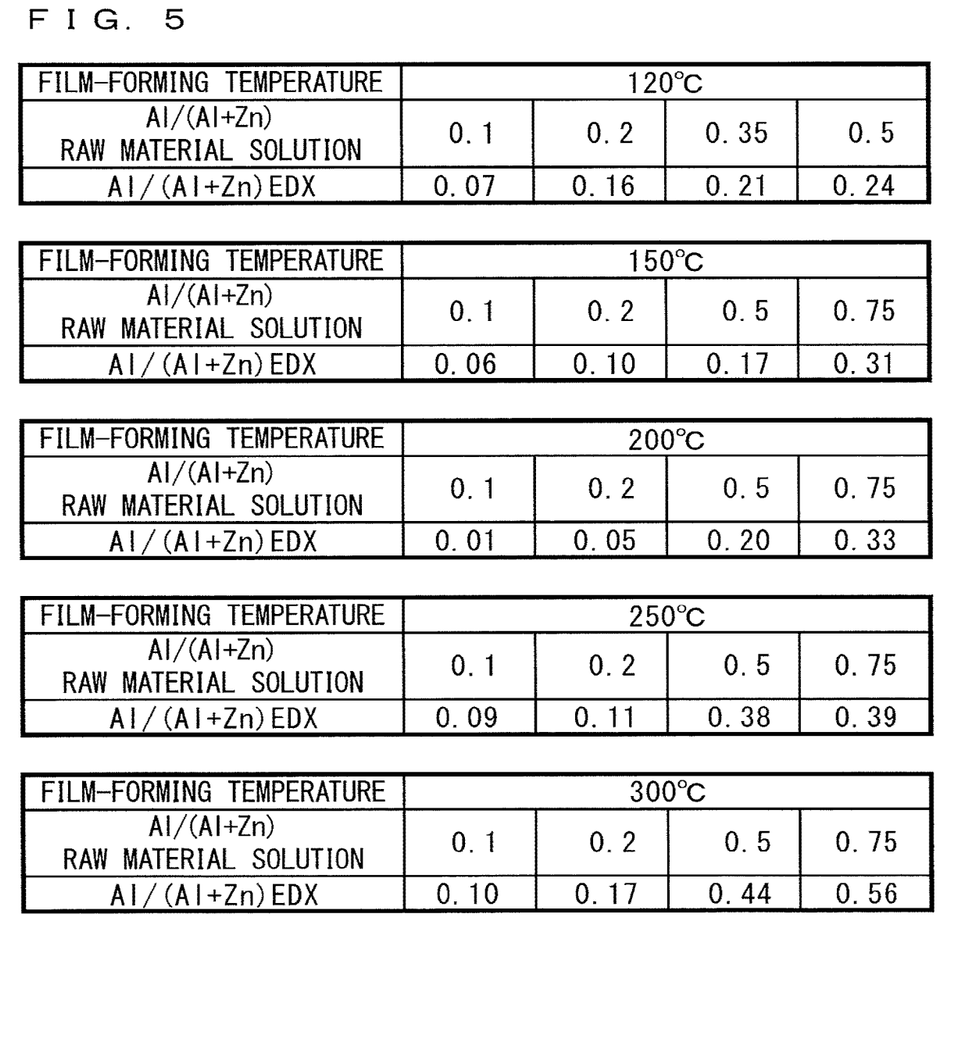
FIG. 5 is a view showing a ratio of aluminum contained as a mixed crystal in a buffer layer produced using a solution containing zinc and aluminum.

FIG. 5 shows the results of detecting, with an energy dispersive X-ray analyzer (EDX apparatus), compositional ratios of the buffer layers ($Zn_{1-x}Al_xO$ films) in which the above-mentioned measurement was performed.

That is, buffer layers ($Zn_{1-x}Al_xO$ films) were film-formed at each film-formation temperature (120° C., 150° C., 200° C., 250° C., 300° C.) using each of solutions 4 whose Al/(Al+Zn) ratio are 0.1, 0.2, 0.35, 0.5 and 0.75 (that is, varying the content of aluminum relative to the content of zinc in the solution 4). Then, the compositional ratio (Al/(Al+Zn) EDX) of each of buffer layers ($Zn_{1-x}Al_xO$ films) was measured using EDX apparatus. The measurement results are shown in a table of FIG. 5.

As is apparent from FIG. 5, when the solution 4 is allowed to contain zinc and aluminum as metal raw materials (to become a mixed crystal) and the buffer layer is film-formed using the solution 4, the film-formed buffer layer contains a predetermined amount of aluminum as a d crystal. That is, by using the solution 4, the $Zn_{1-x}Al_xO$ film is film-formed.

In addition, the present inventors carried out the following experiments.

That is, the solution 4 is allowed to contain zinc and magnesium as metal raw materials and a film is film-formed using the solution 4. Here, the film-forming temperature was 150° C., and ammonia and ozone were supplied to a substrate during film-forming the film. Then, the band gap and the resistivity of the film-formed film were measured, and the compositional ratio of the film was also measured with use of an EDX apparatus.

Here, the content of magnesium relative to the content of zinc in the solution 4 was varied as follows. That is, a ratio Mg/(Mg+Zn) was 0, 0.17, 0.29, 0.375, 0.44, and 0.5.

Figure 6:
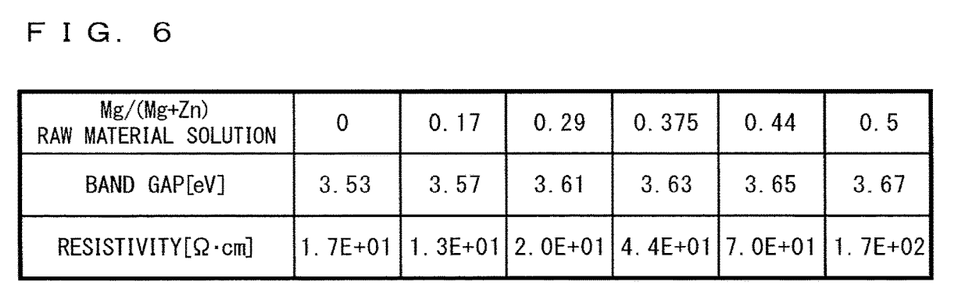
FIG. 6 is a view showing a band gap and resistivity in a film produced using a solution containing zinc and magnesium.

The results of measuring the band gap and the resistivity of the films film-formed using the solution 4 are shown in FIG. 6.

As is apparent from FIG. 6, even when the content of magnesium relative to the content of zinc was varied in the solution 4, the band gap changed little. Also, even when the content of magnesium relative to the content of zinc was varied in the solution 4, changes in resistivity was small.

In addition, the compositional ratio of each film was measured with use of an EDX apparatus, and consequently magnesium was not detected in the film. From this, it is found that magnesium is contained little as a mixed crystal in the film-formed film. The reason for the measurement results of FIG. 6 (that is, even when the amount of magnesium in the solution 4 was varied, the band gap and the resistivity were not changed by large amounts in the film-formed film) is supposed that magnesium is contained little in the film.

In the buffer layer of the present invention, as shown in FIG. 5, aluminum is contained as a mixed crystal in the film-formed buffer layer. Accordingly, as shown in FIGS. 3 and 4, in the buffer layer film-formed, the band gap and the resistivity can be controlled over a wide range.

Figure 7:
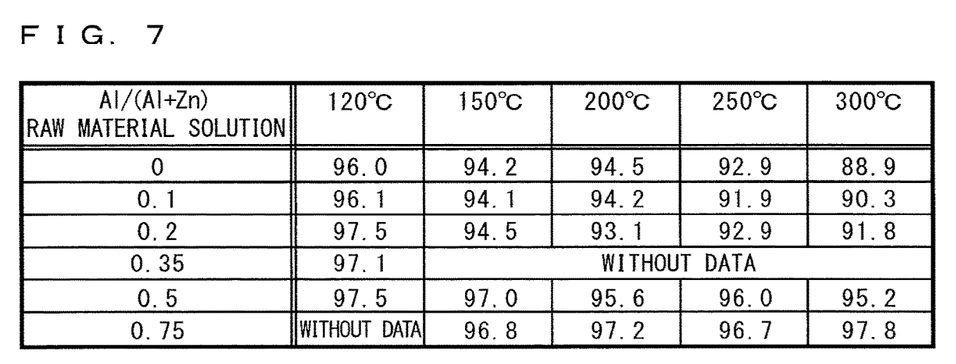
FIG. 7 is a view showing the results of transmittance measurement performed on a film-formed buffer layer.

FIG. 7 is a table showing an average transmittance of the buffer layers ($Zn_{1-x}Al_xO$ films) subjected to the above-mentioned measurement (FIGS. 3, 4).

That is, buffer layers ($Zn_{1-x}Al_xO$ films) were film-formed at each film-formation temperature (120° C., 150° C., 200° C., 250° C., 300° C.) using each of solutions 4 whose Al/(Al+Zn) ratio are 0.1, 0.2, 0.35, 0.5, and 0.75 (that is, varying the content of aluminum relative to the content of zinc in the solution 4). Then, the transmittance of each of the buffer layers ($Zn_{1-x}Al_xO$ films) was measured by irradiating the buffer layers with light of a predetermined wavelength (light of a plurality of wavelengths).

FIG. 7 shows an average transmittance which was obtained by irradiating each buffer film with light of a wavelength of 400 nm to 1500 nm (nearly a visible light region) to measure a transmittance and averaging the transmittances of the buffer films over the above-mentioned wavelength range. In addition, thicknesses of the buffer layers are about 500 nm to 700 nm.

In addition, as described above, the film-formation of the buffer layer was not performed at the film-forming temperatures of 150° C., 200° C., 250° C., or 300° C. in the condition of Al/(Al+Zn)=0.35. Similarly, the film-formation of the buffer layer was not performed at the film-forming temperature of 120° C. in the condition of Al/(Al+Zn)=0.75.

As is apparent from the results of FIG. 7 in each buffer layer, the average transmittance is about 90%, or 90% or more. This indicates that in the buffer layer according to the present invention, aluminum functions as a mixed crystal and does not function as a dopant. That is, when aluminum is contained as a dopant in a film of zinc oxide, the transmittance is reduced, but a reduction of the transmittance is not found in the buffer layer according to the present invention.

In addition, in the experiments concerning FIG. 7, the buffer layer was irradiated with light of a wavelength longer than 1500 nm to measure its transmittance. Consequently, the transmittance exceeding 80% was also maintained when irradiating the buffer layer with light of a wavelength of about 1500 nm to 1700 nm.

It has been described that the buffer layer according to the present invention is a $Zn_{1-x}Al_xO$ film. In the ZnO film not containing Al, since an offset barrier is decreased, it is impossible to adequately perform a function as a buffer layer. On the other hand, in the AlO film not containing Zn, since the film becomes a complete insulating body, similarly, the film does not function as a buffer layer. Therefore, it is important for the buffer layer to have a constitution in which Al and Zn are contained in the film as a mixed crystal.

The present invention has been described in detail, the above-mentioned description is exemplifications in all aspects, and the present invention is not intended to be limited to these. Various modifications not exemplified are construed to be made without departing from the scope of the present invention.

The invention claimed is:

1. A method for film-forming a buffer layer to be used for a solar cell, the buffer layer being disposed between a light absorbing layer and a transparent conductive film comprising:
   (A) forming a solution containing zinc and aluminum as metal raw materials of the buffer layer into a mist by applying an ultrasonic wave to said solution,
   (B) heating a substrate disposed in an atmosphere within a chamber, and
   (C) spraying a mist of said solution atomized in said step (A) to said substrate in said step (B),
   wherein the buffer layer has a resistivity that is 10Ω·cm or greater.

2. The method for film-forming a buffer layer according to claim 1 further comprising the step of:
   (D) supplying ozone to said substrate in said step (B).

3. The method for film-forming a buffer layer according to claim 1, wherein said solution contains ammonia.

4. The method for film-forming a buffer layer according to claim 1, wherein said solution contains a metal compound having zinc and aluminum, and said metal compound is a β-diketone compound.

5. The method for firm-forming a buffer layer according to claim 1, wherein transmittance exceeding 80% is achieved when irradiating the buffer layer with light of a wavelength of between 1500 nm to 1700 nm.

6. A buffer layer to be used for a solar cell, the buffer layer being disposed between a light absorbing layer and a transparent conductive film,
   wherein said buffer layer is a $Zn_{1-x}Al_xO$ film containing zinc and aluminum, provided that 0<x<1; and
   wherein the buffer layer has a resistivity that is 10Ω·cm or greater.

* * * * *